(12) United States Patent
Brodoceanu et al.

(10) Patent No.: US 10,319,705 B2
(45) Date of Patent: Jun. 11, 2019

(54) ELASTOMERIC LAYER FABRICATION FOR LIGHT EMITTING DIODES

(71) Applicant: Facebook Technologies, LLC, Menlo Park, CA (US)

(72) Inventors: Daniel Brodoceanu, Saarbruecken (DE); Oscar Torrents Abad, Saarbrucken (DE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/789,275

(22) Filed: Oct. 20, 2017

(65) Prior Publication Data
US 2019/0123031 A1 Apr. 25, 2019

(51) Int. Cl.
*H01L 25/16* (2006.01)
*H01L 33/00* (2010.01)
(Continued)

(52) U.S. Cl.
CPC ............ *H01L 25/167* (2013.01); *G03F 7/038* (2013.01); *G03F 7/039* (2013.01); *G03F 7/162* (2013.01); *G03F 7/168* (2013.01); *G03F 7/2004* (2013.01); *G03F 7/32* (2013.01); *H01L 21/67144* (2013.01); *H01L 25/0753* (2013.01); *H01L 33/0079* (2013.01); *H01L 33/0095* (2013.01); *H01S 5/0201* (2013.01); *H01S 5/02248* (2013.01); *H01S 5/423* (2013.01); *H01L 33/06* (2013.01); *H01L 33/20* (2013.01); *H01L 33/30* (2013.01); *H01S 5/22* (2013.01); *H01S 5/343* (2013.01)

(58) Field of Classification Search
None
See application file for complete search history.

(56) References Cited

U.S. PATENT DOCUMENTS 8,865,489 B2 * 10/2014 Rogers ................ H01L 25/0753
438/27
9,548,332 B2 * 1/2017 Hu ......................... H01L 27/156
(Continued)

FOREIGN PATENT DOCUMENTS

| DE | 10 2007 043902 A1 | 3/2009 |
| WO | WO 2014-150263 A1 | 9/2014 |
| WO | WO 2017/037475 A1 | 3/2017 |

OTHER PUBLICATIONS

PCT International Search Report and Written Opinion, PCT Application No. PCT/US2018/054710, dated Feb. 8, 2018, fifteen pages.
(Continued)

*Primary Examiner* — Bradley Smith
(74) *Attorney, Agent, or Firm* — Fenwick & West LLP

(57) ABSTRACT

An elastomeric interface layer (elayer) is formed over multiple light emitting diode (LED) dies by depositing photoresist materials across multiple LED dies, and using the LED dies as a photolithography mask to facilitate formation of the elayer on each LED die. The elayer facilitates adhesive attachment of each LED die with a pick and place head (PPH), allowing the LED dies to be picked up and placed onto a display substrate including control circuits for subpixels of an electronic display. In some embodiments, the LED dies are micro-LED (μLED) dies.

20 Claims, 15 Drawing Sheets

(51) Int. Cl.
  *H01S 5/42*    (2006.01)
  *H01L 25/075*  (2006.01)
  *H01S 5/02*    (2006.01)
  *H01S 5/022*   (2006.01)
  *G03F 7/16*    (2006.01)
  *G03F 7/038*   (2006.01)
  *G03F 7/20*    (2006.01)
  *G03F 7/32*    (2006.01)
  *G03F 7/039*   (2006.01)
  *H01L 21/67*   (2006.01)
  *H01L 33/20*   (2010.01)
  *H01L 33/30*   (2010.01)
  *H01L 33/06*   (2010.01)
  *H01S 5/343*   (2006.01)
  *H01S 5/22*    (2006.01)

(56) References Cited

U.S. PATENT DOCUMENTS

| | | |
|---|---|---|
| 2004/0097006 A1 | 5/2004 | Lowery |
| 2005/0214962 A1* | 9/2005 | Daniels ............ H01L 27/14625 438/22 |
| 2009/0176324 A1 | 7/2009 | Tsai |
| 2012/0056228 A1 | 3/2012 | Horng et al. |
| 2016/0293794 A1 | 10/2016 | Nuzzo et al. |
| 2017/0278733 A1 | 9/2017 | Chang et al. |

OTHER PUBLICATIONS

European Patent Office, Extended European Search Report and Opinion, European Patent Application No. 18201220.3, dated Feb. 12, 2019, nine pages.

* cited by examiner

900

Deposit a photoresist material on and between LED dies on the carrier substrate
902

Apply light through the carrier substrate towards the LED dies and the deposited photoresist material, responsive to depositing the photoresist material
904

Absorb a portion of the light incident on the LED dies to retain insoluble first portions of the photoresist material on the LED dies
906

Expose second portions of photoresist material between the LED dies to another portion of the light to render second portions soluble
908

Remove the second portions of the photoresist material to retain the first portions of the photoresist material that form elastomeric interface layers on the LED dies
910

FIG. 9

ELASTOMERIC LAYER FABRICATION FOR LIGHT EMITTING DIODES

BACKGROUND

The present disclosure relates to semiconductor device fabrication, specifically to placing a conformable material over light emitting diode (LED) dies to facilitate adhesive attachment in display fabrication.

In LED display fabrication, LEDs may be moved from one substrate to another. That is, micro-LEDs of different color may be transferred from source substrates where the micro-LEDs were fabricated onto carrier substrates, and then from carrier substrates onto a display substrate including control circuits for controlling the micro-LEDs. Transferring the micro-LEDs from the carrier substrates onto the display substrate may involve picking and placing of LEDs onto desired locations on the display substrate. As the form factor of LED's decreases, the picking and placing of LEDs into desired arrangements and without damaging the LED dies becomes increasingly difficult.

SUMMARY

Embodiments relate to forming an elastomeric interface layer (elayer) over multiple light emitting diode (LED) dies by depositing photoresist materials across multiple LED dies, and using the LED dies as a photolithography mask to facilitate formation of the elayer on each LED die. The elayers facilitate adhesion with a pick-up head for pick and place operation during the manufacturing of an electronic display.

In some embodiments, a photoresist material on and between light emitting diode (LED) dies is deposited on a carrier substrate. The photoresist material may be a negative photoresist material that becomes insoluble when exposed to light. After depositing the photoresist material, light is applied through the carrier substrate towards the LED dies and the deposited photoresist material. A portion of the light incident on the LED dies is absorbed by the LED dies to retain soluble first portions of the photoresist material on the LED dies. Other portions of photoresist material between the LED dies are exposed to the light, causing second portions of the photoresist material between the LED dies to become insoluble. After applying the light, the soluble first portions of photoresist material on the LED dies are removed, such as by dissolving in a photoresist developer. After removing the first portions of the photoresist material on the LED dies, an elastomeric material is deposited on each LED die and between the second portions of photoresist. The second portions of the photoresist material are removed after depositing the elastomeric material. The elastomeric material remaining on the LED dies forms elastomeric interface layers on the LED dies to facilitate adhesion with a pick and place head (PPH) (or a "pick-up head").

In some embodiments, at least a portion of the LED dies on the carrier substrate can be picked up by attaching a non-conformable pick-up head to the elastomeric interface layers over the LED dies. At least a portion of the LED dies attached to the non-conformable pick-up head are placed on a display substrate defining pixel control circuits of an electronic display.

In some embodiments, the first portions of photoresist material are removed by dissolving the first portions with a first solvent. The first solvent may be a photoresist developer. The second portions of the photoresist material are used as molds for forming the elastomeric layers, and then removed, such as by dissolving the second portions of the photoresist material with a second solvent different from the first solvent, such as a photoresist stripping material that removes insoluble photoresist material. The first solvent is benign to the second portions of the photoresist material, and the second solvent is benign to the elastomeric material forming the elastomeric interface layers on the LED dies. In some embodiments, the second portions of photoresist material are removed by applying light to cause the second portions to become soluble, and then dissolving the second portions using the same solvent used in dissolving the first portions of photoresist material.

In some embodiments, the LED dies are micro-LED (mLED) dies. In some embodiments, an elastomeric interface layer is formed over multiple vertical-cavity surface-emitting lasers (VCSELs), or other types of LEDs. In some embodiments, the LED dies include Gallium nitride (GaN), gallium arsenide (GaAs), or gallium phosphide (GaP). In some embodiments, the LED dies absorb Ultraviolet (UV) light incident on the LED dies through the carrier substrate.

In some embodiments, an electronic display panel is fabricated. A photoresist material is deposited on and between light emitting diode (LED) dies on a carrier substrate. Light is applied through the carrier substrate towards the LED dies and the deposited photoresist material, responsive to depositing the photoresist material. A portion of the light incident on the LED dies is absorbed by the LED dies to retain soluble first portions of the photoresist material on the LED dies. Other portions of photoresist material between the LED dies are exposed to the light to render second portions of the photoresist material between the LED insoluble. The first portions of photoresist material are removed, responsive to applying the light, such as by dissolving with a photoresist developer. An elastomeric material is deposited on each LED die and between the second portions of photoresist, responsive to removing the first portions. The second portions of the photoresist material are removed responsive to depositing the elastomeric material, the elastomeric material forming elastomeric interface layers on the LED dies. At least a portion of the LED dies are picked up on the carrier substrate by attaching a non-conformable pick-up head to the elastomeric interface layers over the LED dies. The at least a portion of the LED dies attached to the non-conformable pick-up head are placed on a display substrate defining pixel control circuits of an electronic display.

Some embodiments include using a positive photoresist material that is also an elastomeric material to form elastomeric interface layers on the LED dies. A photoresist material is deposited on and between LED dies on a carrier substrate. Light is applied through the carrier substrate towards the LED dies and the photoresist material. A portion of the light incident on the LED dies is absorbed to retain insoluble first portions of the photoresist material on the LED dies insoluble. Second portions of the photoresist material between the LED dies are exposed to another portion of the light to render the second portions soluble. Here, the photoresist material may be a positive photoresist that becomes soluble when exposed to the light. The soluble second portions of the photoresist material are removed, and the first portions of the photoresist material are retained to form elastomeric interface layers on the LED dies. In some embodiments, the second portions of the photoresist material are removed by dissolving the second portions with a solvent.

In some embodiments, an electronic display panel is fabricated. A photoresist material is deposited on and between light emitting diode (LED) dies on a carrier substrate. Light is applied through the carrier substrate towards the LED dies and the photoresist material, responsive to depositing the photoresist material. A portion of the light incident on the LED dies is absorbed to retain insoluble first portions of the photoresist material on the LED dies. Second portions of the photoresist material between the LED dies are exposed to another portion of the light to render the second portions soluble. The second portions of the photoresist material are removed but the first portions of the photoresist material remain to form an elastomeric interface layer on the LED dies. At least a portion of the LED dies on the carrier substrate are picked up by attaching a non-conformable pick-up head to the elastomeric interface layers over the LED dies. The at least a portion of the LED dies attached to the non-conformable pick-up head are placed on a display substrate defining pixel control circuits of an electronic display.

BRIEF DESCRIPTION OF DRAWINGS

FIG. 9 is a flowchart of a method for forming an elayer over LED dies on the carrier substrate, with a positive photoresist material, according to one embodiment.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures, where like reference numbers indicate identical or functionally similar elements. Also in the figures, the left most digits of each reference number corresponds to the figure in which the reference number is first used.

Embodiments relate to depositing an elastomeric interface layer (elayer) over multiple light emitting diode (LED) dies by using photoresist materials rather than physical molds or processes that may damage the elayer or the LED dies. The deposited elayer allows each LED to be picked up by a pick-up head (or pick and place head (PPH)), and placed onto a display substrate including control circuits for sub-pixels of an electronic display. In some embodiments, the LED dies are micro-LED (mLED) dies.

Figure 1:
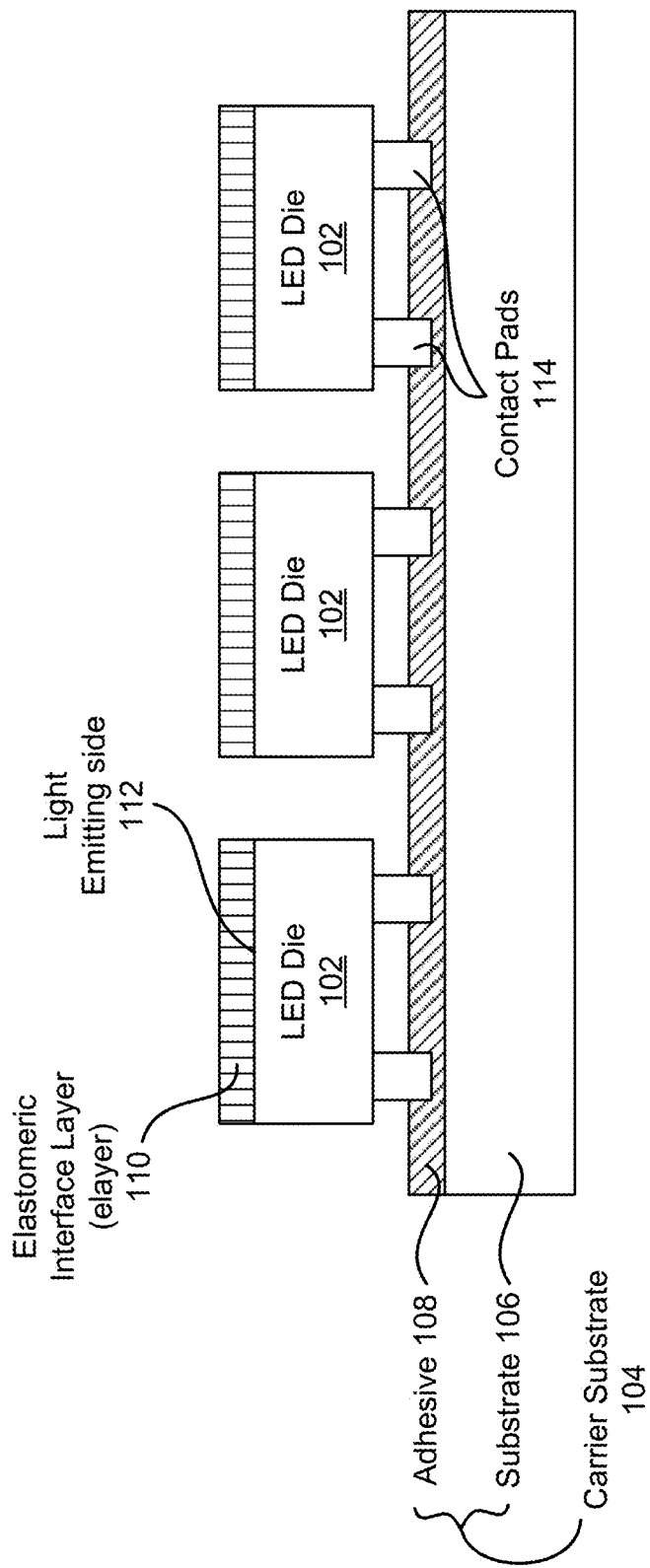
FIG. 1 is a cross sectional view of LED dies on a carrier substrate with an elastomeric interface layer (elayer) over each LED die, according to one embodiment.

FIG. 1 is a cross sectional view of LED dies 102 on a carrier substrate 104 with an elastomeric interface layer (elayer) 110 over each LED die 102, according to one embodiment. The LED dies 102 may be fabricated on a source substrate and placed onto the carrier substrate 104 to facilitate pick and place onto a display substrate of an electronic display. The carrier substrate 104 may include a substrate 106 on which the LED dies 102 are placed, and an adhesive layer 108 that holds the LED dies 102 on the substrate 106.

The elayer 110 is formed on the light emitting side 112 of each LED die 102. The elayer 110 is a conformable layer that allows each of the LED dies 102 to be attached to and picked up by a pick and place head (PPH) (e.g., as discussed in greater detail with reference to FIG. 13). In particular, the elayer 110 facilitates attachment with non-conformable pick-up surfaces 1304 of the PPH 1302, or in another example, conformable pick-up surfaces 1304 of a PPH 1302. The elayer 110 may attach to a pick-up surface 1304 due to adhesion forces, such as Van der Waals. The elayer 110 may include any material that provides sufficient adhesion to the pick-up surfaces 1304. For example, the elayer 110 includes elastomers, such as Polydimethylsiloxane (PDMS) or Polyurethane (PU). In some embodiments, the interface layer on the light emitting side 112 of the LED dies 102 contains no elastomeric materials. For example, the elayer 110 includes gels that provides adhesion via covalent chemical bonds. The elayer 110 may be polymer with viscoelasticity (having both viscosity and elasticity). The elayer 110 may also include materials that have weak inter-molecular forces, a low Young's modulus, and/or high failure strain compared with other materials.

Figure 14:
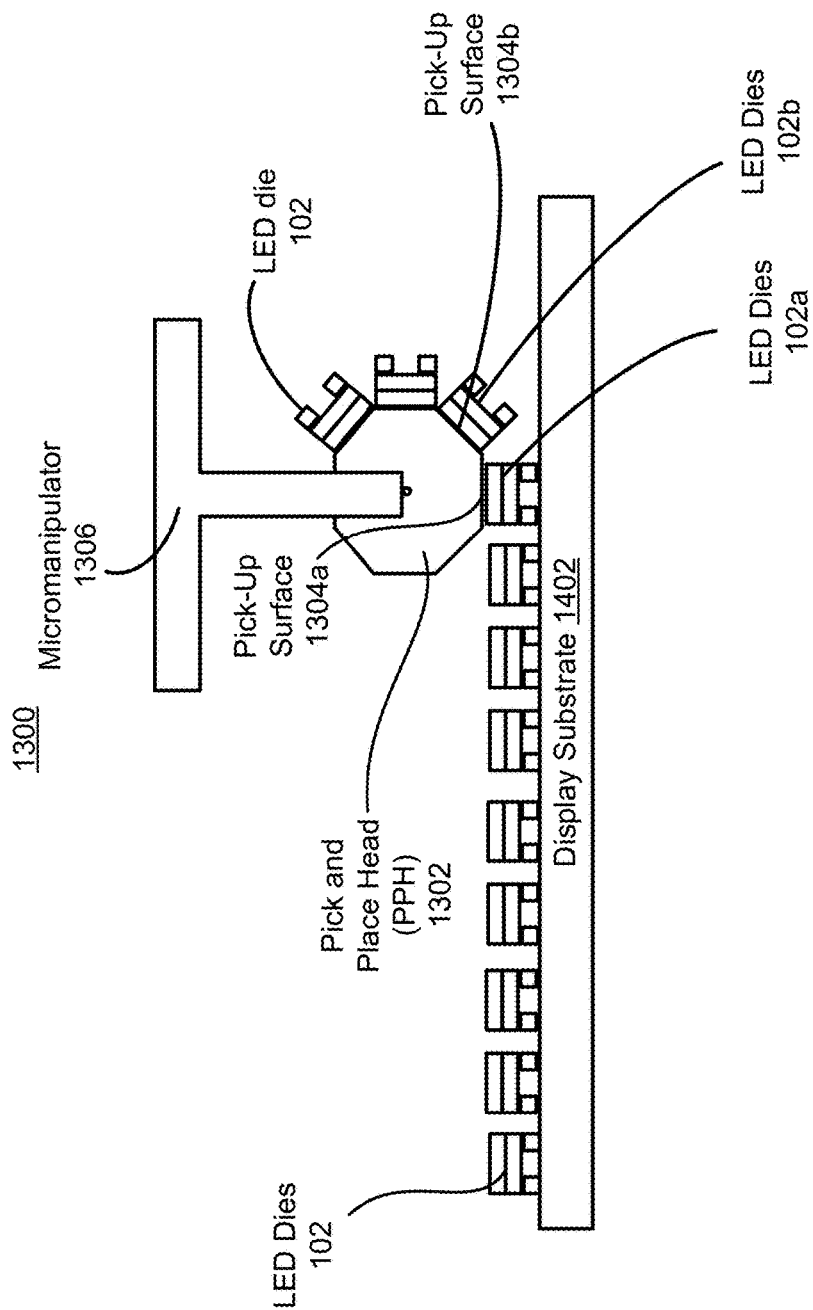
FIG. 14 is a display manufacturing system during placement of LED dies on a display substrate, according to one embodiment.

The side of each LED die 102 facing the carrier substrate 104 includes contact pads 114. Each of the LED dies 102 emit light out of the light emitting side 112 if an electric potential is applied between electrical contact pads 114. The electrical contact pads 114 connect with control circuits in a display substrate (e.g., as shown in FIG. 14) that drive the LED dies 102 when the LED dies 102 are mounted to the display substrate.

As discussed in greater detail below in connection with FIG. 15, the LED dies 102 may be mLED dies including an epitaxial structure with gallium, such as gallium nitride (GaN), gallium arsenide (GaAs), or gallium phosphide (GaP). The gallium material of the LED dies may block certain wavelengths of light to serve as a mask for photoresist material used in forming the elayer 110. In some embodiments, the method and principles as described with reference to LED dies 102 can be applied to other semiconductor or microelectronic devices. For example, an elayer may be formed on a vertical-cavity surface-emitting laser (VCSEL) to facilitate pick and place of the VCSEL.

The carrier substrate 104 has a flat surface mounted with LED dies 102 that supports the LED dies 102 during the process of forming the elayer 110 over each LED die 102. The carrier substrate 104 is transparent to, at least some, wavelengths of light. For example, the carrier substrate 104 may include a glass or sapphire substrate that is transparent to light that changes photoresist material state and is absorbed by the LED dies 102. This allows light to be applied through the carrier substrate 104 to the bottom sides of the LED dies 102 and the regions between the LED dies 102, resulting in photoresist material over LED dies 102 to be blocked from the light and exposing photoresist material between the LED dies 102 to the light. The carrier substrate 104 may have any number of LED dies 102 attached, such as one or more arrays of LED dies. The carrier substrate 104 may have a hard flat surface, rigid enough to support the LED dies 102 as the carrier substrate 104 is moved. In some embodiments, the LED dies 102 are released from the carrier substrate 104 by removing the adhesive 108 (e.g., with a solvent, wet or dry etching, etc.), or weakening the adhesive 108. In other embodiments, the adhesive 108 is weak enough that the LED dies 102 may be removed with force (e.g., by a PPH 1302) without damaging the LED dies 102.

Figure 2:
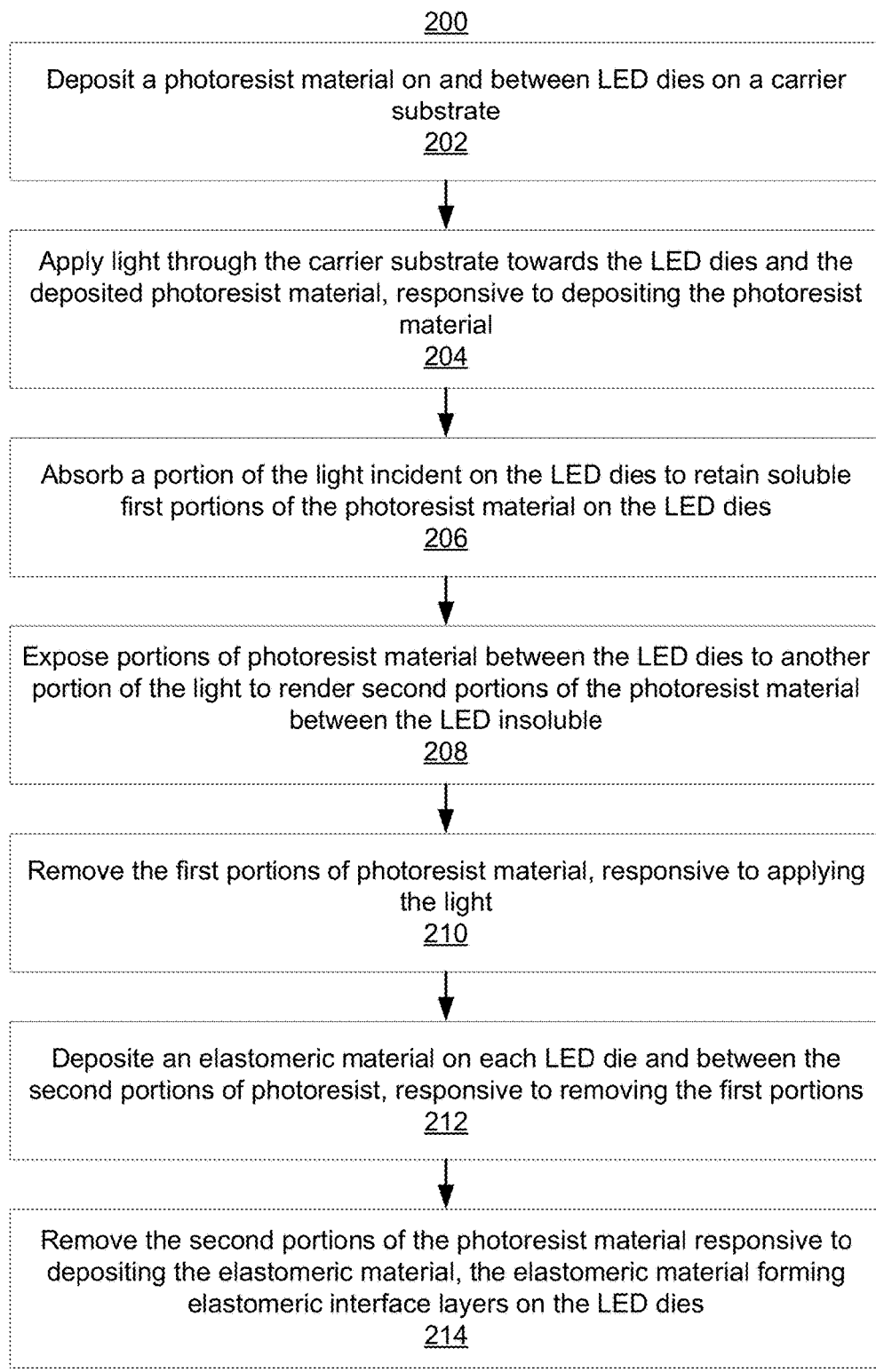
FIG. 2 is a flowchart of a method for forming an elayer over LED dies on the carrier substrate, with a negative photoresist material, according to one embodiment.

FIG. 2 is a flowchart of a method 200 for forming an elayer 110 over LED dies 102 on the carrier substrate 104, according to one embodiment. Specifically, a negative photoresist material provides a temporary template for forming the elayer 110 that can be gently removed without damaging the elayer 110 or LED dies 102. Among other advantages, the method 200 provides for simultaneous formation of an elayer 110 on multiple LED dies 102 without disturbing the positions of the LED dies 102 or damaging the LED dies 102 or the elayers 110. The steps may be performed in different orders, and the method 200 may include different, additional, or fewer steps. The method 200 is discussed with reference to FIGS. 3 through 8, which show the formation of the elayer 110 on LED dies 102.

Figure 3:
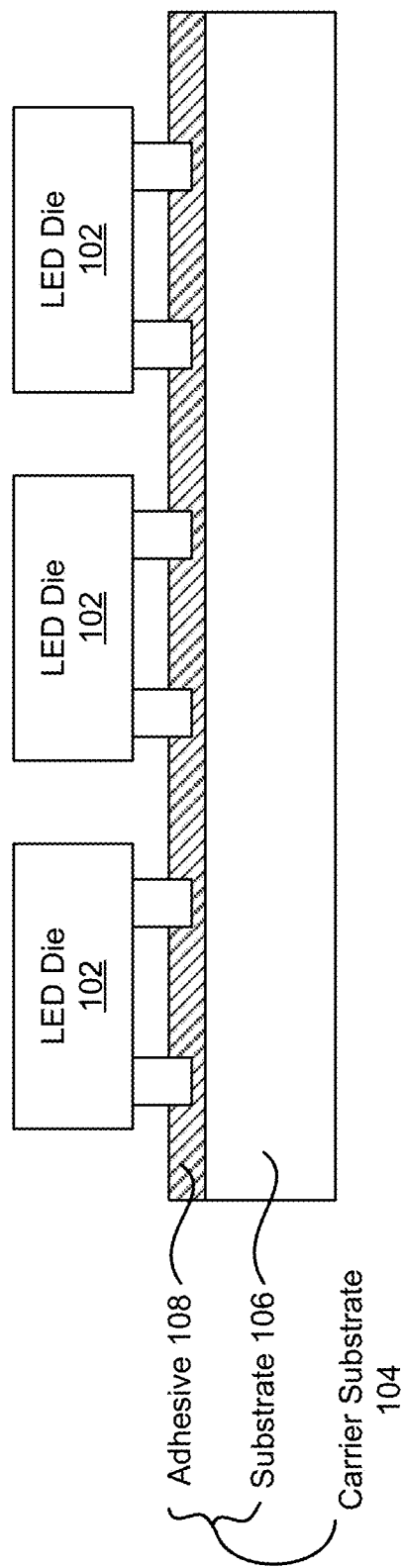
FIG. 3 is a cross sectional view of LED dies on the carrier substrate, according to one embodiment.
Figure 4:
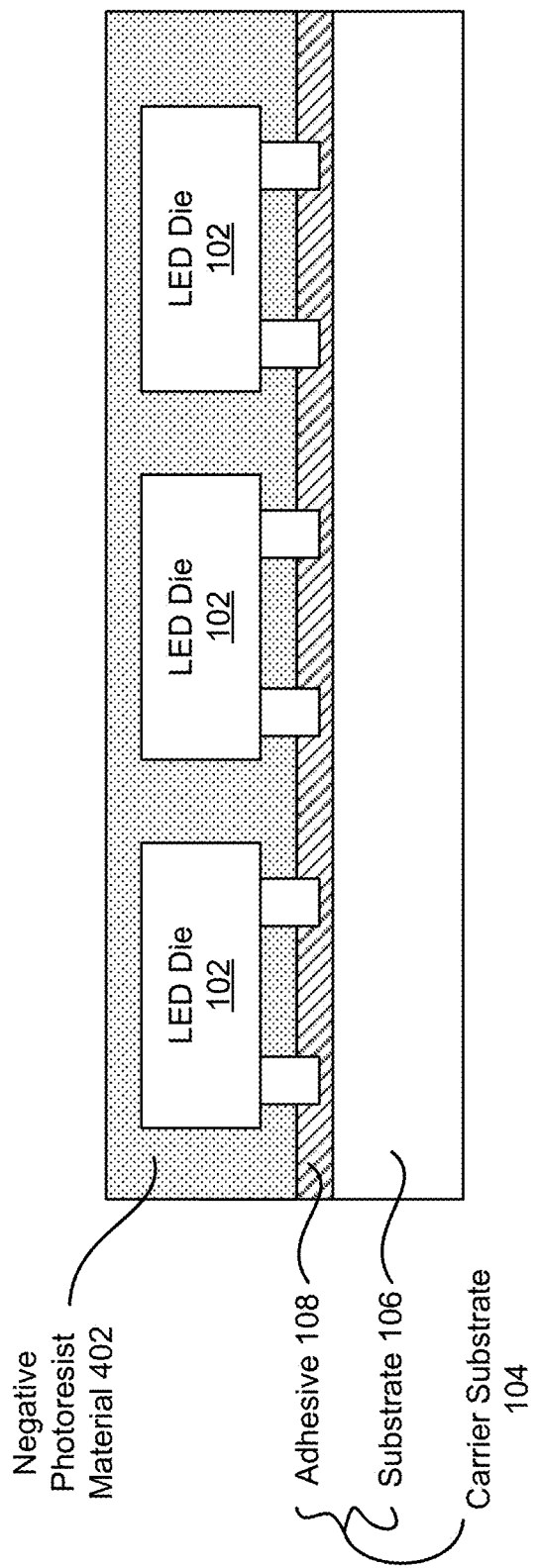
FIG. 4 is a cross sectional view of LED dies on the carrier substrate with negative photoresist material on and between the LED dies, according to one embodiment.

A negative photoresist material is deposited 402 in the regions between the LED dies 102 on the carrier substrate 104 and over the LED dies 102. With reference to FIG. 3, showing a cross sectional view of the LED dies 102 on the carrier substrate 104, the LED dies 102 may be evenly spaced apart on the carrier substrate 104 and attached to the carrier substrate 104 via a layer of adhesive 108. With reference to FIG. 4, showing a cross sectional view of the LED dies with negative photoresist material 402, the negative photoresist material 402 is a light-sensitive material that is initially soluble and becomes insoluble when exposed to light. For example, without exposure to the light, the negative photoresist material 402 can be removed with a solvent, such as a photoresist developer. The negative photoresist material 402 can be mixed with a solvent such that the negative photoresist material 402 is viscous for placement (e.g., via spin coating) onto the LED dies 102 and carrier substrate 104, and then baked (e.g., soft baking) on the LED dies 102.

The carrier substrate 104 may be an intermediate substrate to facilitate LED die 102 transfer between a native substrate and the display substrate 1402. The space between the LED dies 102 may be a result of the singulation process (in which a single group of LED dies 102 are separated into individual LED dies 102) or another process that creates the open regions between the LED dies 102.

For example, the open regions between the LED dies 102 may be formed by the use of an expanding carrier film. The carrier film is attached to a first side of the LED dies 102 on a native substrate. The LED dies 102 may be singulated before or after the carrier film is attached to the LED dies 102. After the LED dies 102 are detached from the native substrate, the LED dies 102 are separated by expanding the carrier film to widen the open regions between the LED dies 102. The carrier substrate 104 is applied to a second side of the LED dies 102. The LED dies 102 are attached to the adhesive 108 layer of the carrier substrate 104 with the open regions being defined between the LED dies 102. The carrier film is separated from the first side of the LED dies 102 to expose the first die of the LED dies 102 for formation of the elayer 110.

Figure 5:
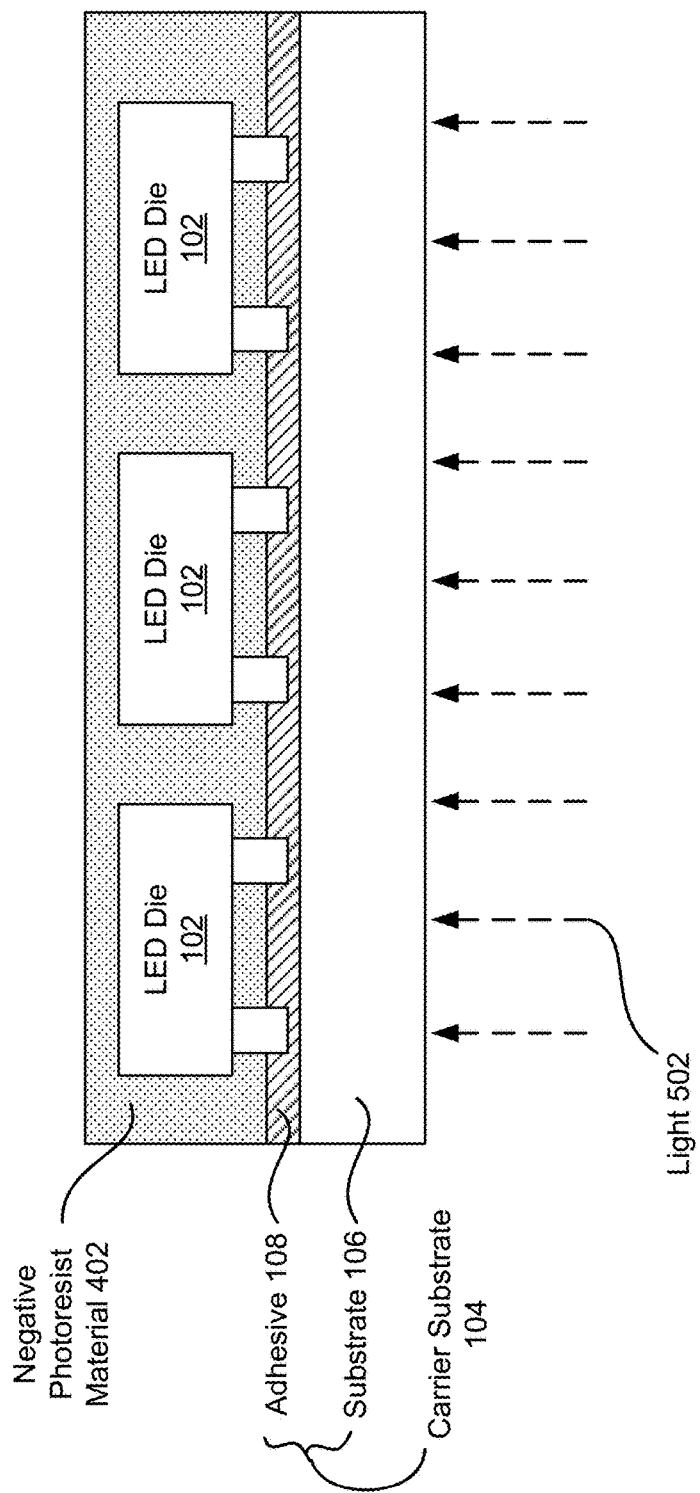
FIG. 5 is a cross sectional view of the LED dies, with the addition of applied light, according to one embodiment.

After depositing the negative photoresist material 402, light is applied 204 through the carrier substrate 104 towards the LED dies 102 and the deposited negative photoresist material 402. With reference to FIG. 5, showing a cross sectional view of the LED dies 102 with applied light 502, the carrier substrate 104 is, at least partially, transparent to the applied light 502. The transparent carrier substrate 104 allows the light 502 to shine on portions of the negative photoresist material 402 between the LED dies 102 that are not blocked by the LED dies 102. By applying light through the carrier substrate 104 and using the LED dies 102 to block portions of the light 502, a separate photomask or masking process to selectively block light from reaching portions of the negative photoresist material 402 is not needed. In some embodiments, the light 502 is collimated ultraviolet (UV) light, and the carrier substrate 104 includes glass or sapphire that is transparent to the UV light 502, while the LED dies 102 include gallium or other material that absorbs the UV light 502. However, other wavelengths of light and materials may be used such that the substrate is transparent to the light, the LED dies absorb the light, and the light changes the state of the photoresist.

Figure 6:
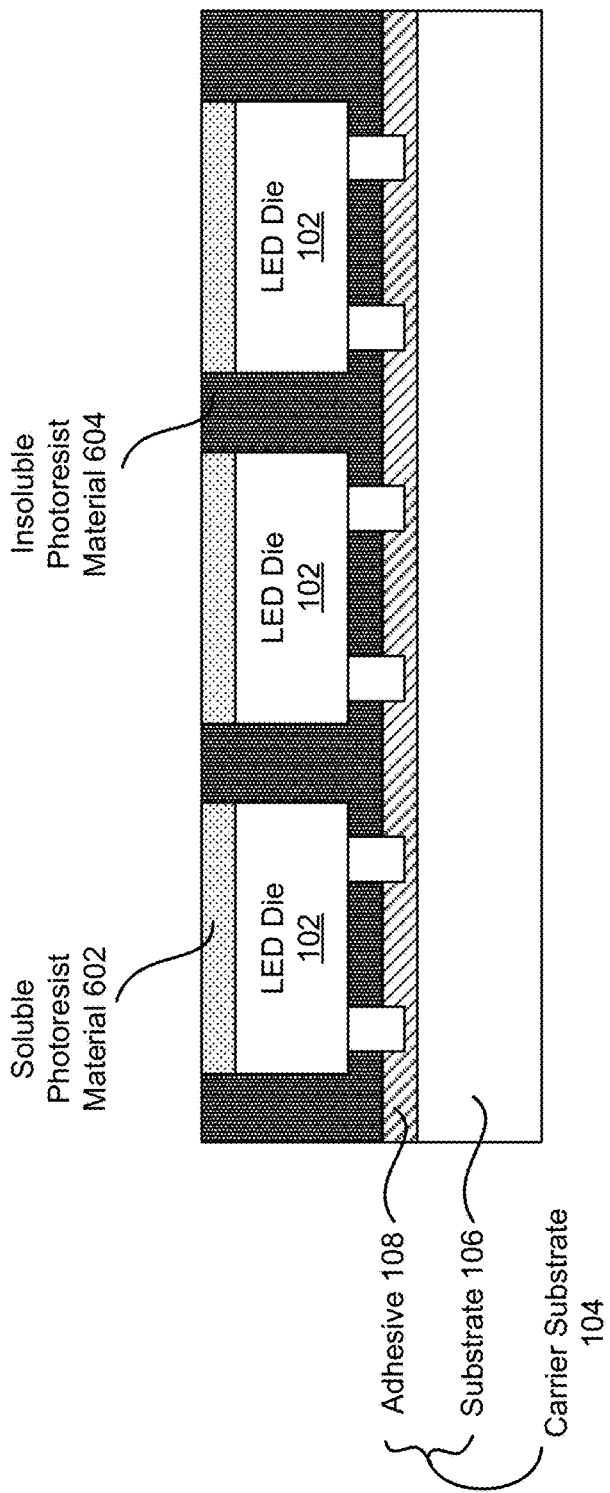
FIG. 6 is a cross sectional view of the LED dies on the carrier substrate with portions of soluble photoresist material and insoluble photoresist material caused by the applied light, according to one embodiment.

Light 502 incident on the LED dies is absorbed 206 to retain soluble first portions of the negative photoresist material 402 on the LED dies 102. With reference to FIG. 6, showing a cross sectional view of the LED dies 102 with soluble photoresist material 602 and insoluble photoresist material 604, the light 502 is directed at the LED dies 102 is absorbed by the LED dies 102 so that the negative photoresist material 402 on top of the LED dies 102 is not exposed to the applied light 502 and remains soluble photoresist material 602.

Portions of the negative photoresist material 402 between the LED dies 102 are exposed 208 to light 502 to render the second portions of the negative photoresist material 402 between the LED dies 102 insoluble. With reference to FIG. 6, insoluble photoresist material 604 is formed between the LED dies 102. Because the negative photoresist material 402 is a negative resist, the light 502 renders the photoresist material insoluble, creating the insoluble photoresist material 604 between the LED dies 102. In some embodiments, the insoluble photoresist material 604 can be insoluble to a first solvent, such as a photoresist developer, but soluble to a second solvent, such as a photoresist stripper.

Figure 7:
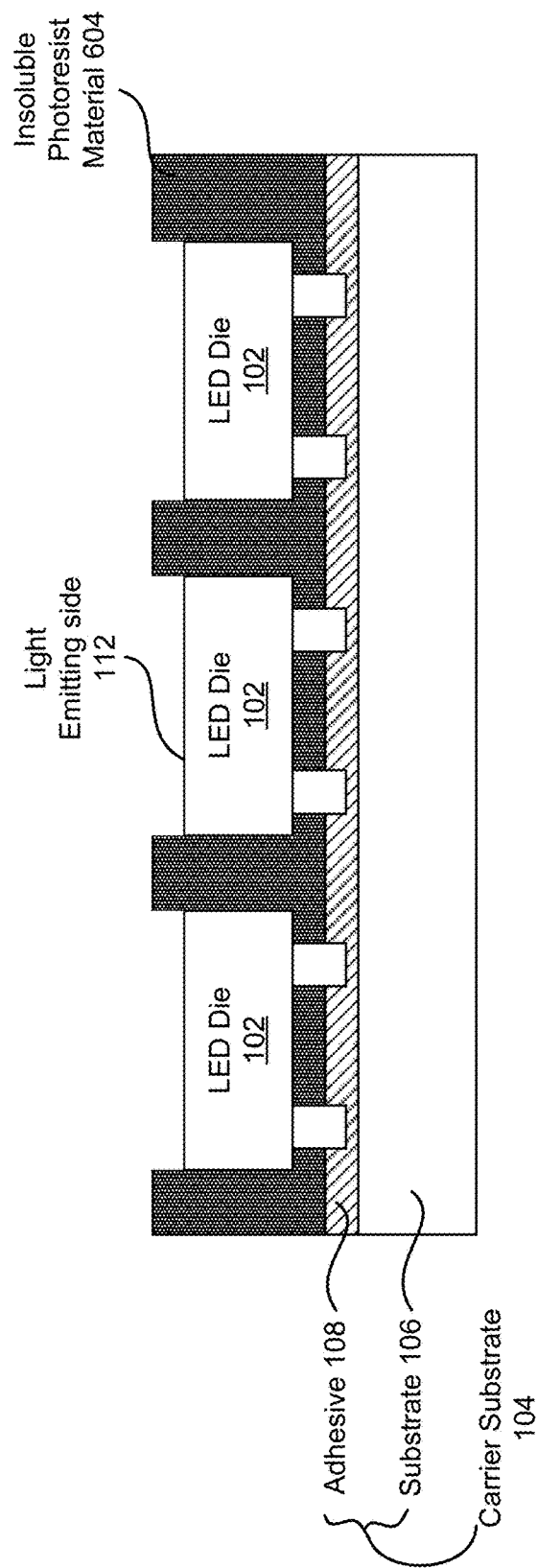
FIG. 7 is a cross sectional view of the LED dies with the portions of soluble photoresist material removed, according to one embodiment.

After applying the light 502, first portions of the negative photoresist material 402 over the LED dies 102 are removed 210. With reference to FIG. 7, showing a cross sectional view of the LED dies 102 with soluble photoresist material 602 removed over the LED dies 102, the soluble photoresist material 602 is removed to expose the light emitting side 112 of the LED dies 102. Since the first portions the negative photoresist material 402 over the LED dies 102 were not exposed to the light 502, the first portions are soluble photoresist material 602. The soluble photoresist material 602 is soluble to a solvent, such as a photoresist developer like sodium or potassium carbonate solution. The solvent is a substance that reacts to remove the soluble photoresist material 602 while being benign to the insoluble photoresist material 604. For example, the solvent is a liquid that dissolves the soluble photoresist material 602.

Figure 8:
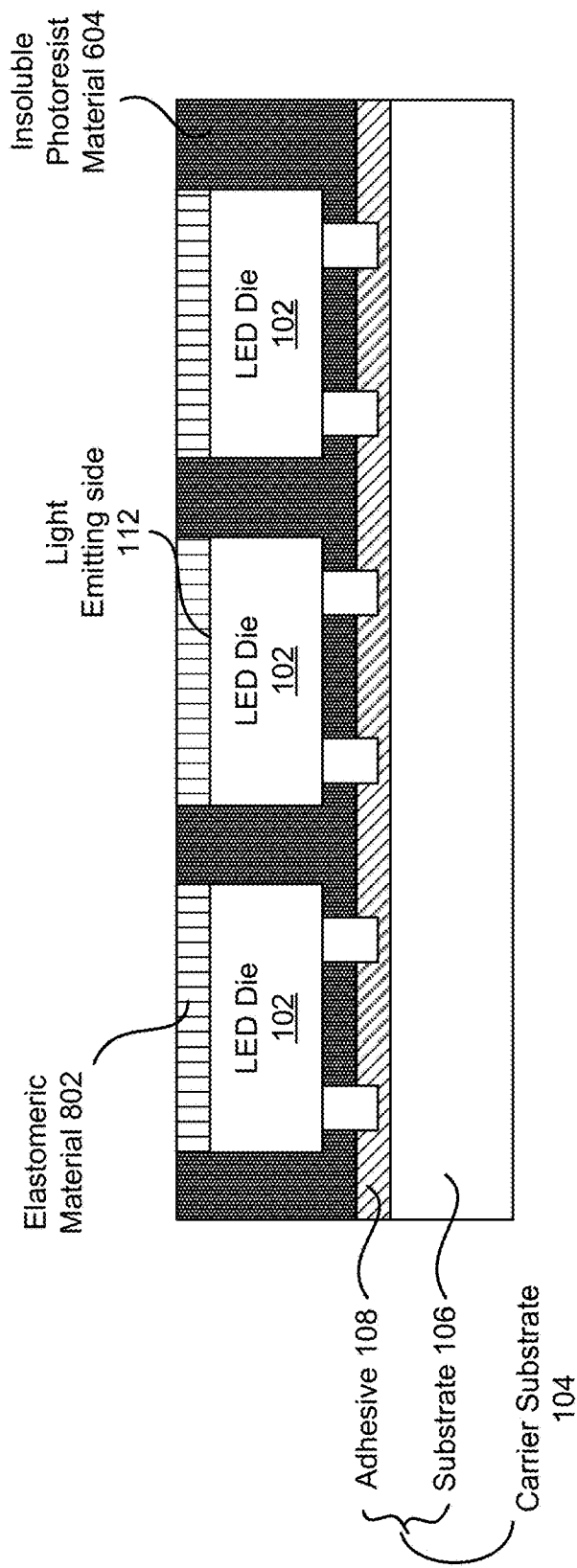
FIG. 8 is a cross sectional view of the LED dies including elastomeric material, according to one embodiment.

Elastomeric material 802 is deposited 212 on each LED die 102 and between the second portions of insoluble photoresist material 604, after removing the first portions of soluble photoresist material 602. With reference to FIG. 8, showing a cross sectional view of the LED dies 102 with elastomeric material 802, the soluble photoresist material 602 is removed resulting in the insoluble photoresist material 604 forming a mold for the elastomeric material 802. The elastomeric material 802 is formed on the light emitting side 112 of the LED dies 102 between the mold walls of the insoluble photoresist material 604. The elastomeric material 802 forms the elayer 110 over the LED dies. As discussed with reference to FIG. 1, the elastomeric material 802 which forms the elayer 110 may include any material that provides sufficient adhesion to the pick-up surfaces 1304. In some embodiments, the elastomeric material 802 is cured. The curing may harden the elastomeric material 802 and attaches the elastomeric material 802 on the LED dies 102 elastomeric material 802. The elastomeric material 802 may be cured in various ways, such as by application of light, heat, chemical additives, and/or vulcanization.

After depositing the elastomeric material 802, the second portions of the photoresist material (the insoluble photoresist material 604) are removed 214, resulting in the elastomeric material 802 forming an elayer 110 on each of LED dies 102. With reference to FIG. 1, separate elayers 110 are on each of the LED dies 102, and the photoresist material used in forming the elayers 110 is removed. The second portions of the insoluble photoresist material 604 form a mold that can be removed in a manner that is benign to the elastomeric material 802. In some embodiments, the second portions of the insoluble photoresist material 604 are removed after the elastomeric material 802 is cured. In other embodiments, the elastomeric material 802 is cured after removal of the insoluble photoresist material 604. In some embodiments, the insoluble photoresist material 604 can be removed with a solvent different from the solvent used to remove the soluble photoresist material 602. For example, the insoluble photoresist material 604 may be removed using a photoresist stripping material for insoluble photoresist, such as acetone. In other embodiments, the negative photoresist material 402 is a reversible photoresist, such that the insoluble photoresist material 604 is reversed (e.g., by application of light) to become soluble photoresist material, and then removed with a solvent developer (e.g., the same solvent used to remove the first portions of photoresist material. For example, laser light incident upon the insoluble photoresist material 604 may be used to render the material soluble. In other embodiments, the insoluble photoresist material 604 is removed by dry etching, for example with an oxygen or air radio frequency (RF) plasma. After the insoluble photoresist material 604 is removed, the elastomeric material 802 forms an elayer 110. The elayer 110 is conformable layer that allows each of the LED dies 102 to be attached to and picked up by a pick-up surface 1304 of a pick and place head (PPH) 1302.

FIG. 9 is a flowchart of a method 900 for forming an elayer 110 over LED dies 102 on the carrier substrate 104, according to one embodiment. The method 900 includes a positive material that forms the elayer 110 over the LED dies 102. Among other advantages, the method 900 provides for simultaneous formation of an elayer 110 on multiple LED dies 102 without disturbing the positions of the LED dies 102 or damaging the LED dies 102 or the elayers 110. After forming the elayers 110, the method 900 allows each LED die 102 to be picked up by a PPH 1302 and moved to a display substrate 1402 (e.g., as discussed in greater detail below with reference to FIGS. 13 and 14). The steps may be performed in different orders, and the method 900 may include different, additional, or fewer steps. The method 900 is discussed with reference to FIGS. 10 through 12, which show the formation of the elayer 110 on LED dies 102.

Figure 10:
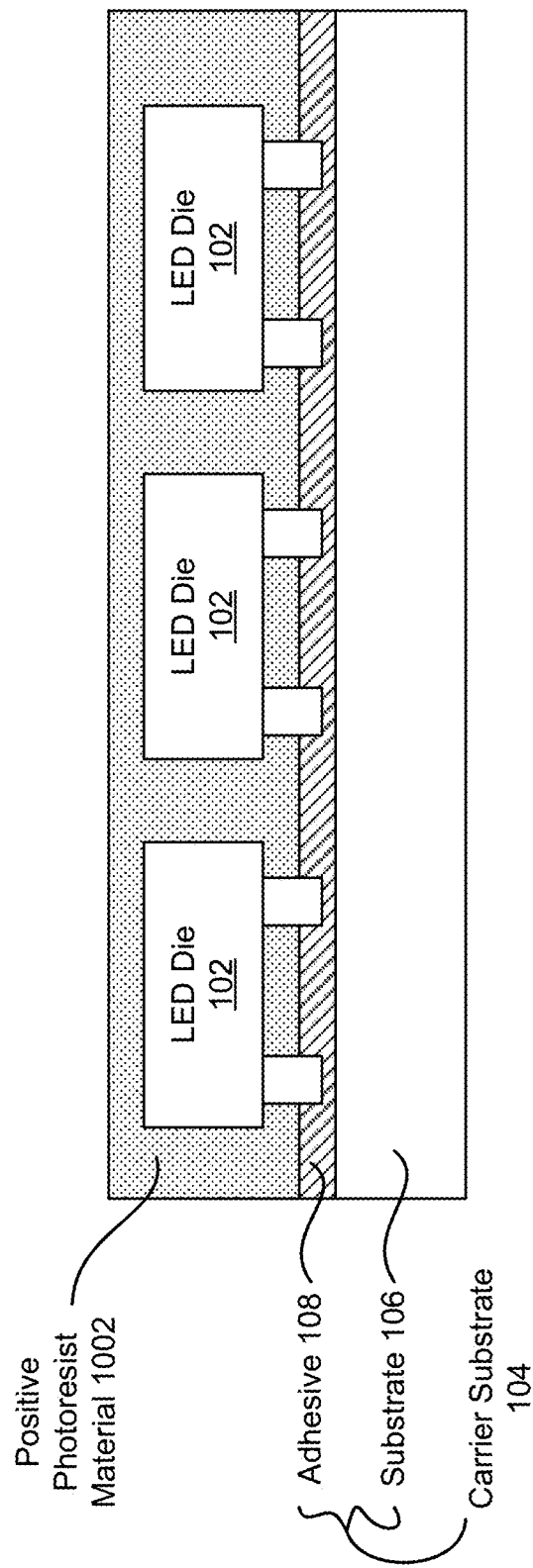
FIG. 10 is a cross sectional view of LED dies on the carrier substrate with positive photoresist material on and between the LED dies, according to one embodiment.

Positive photoresist material is deposited 902 in the regions between the LED dies 102 on the carrier substrate 104 and over the LED dies 102. The LED dies 102 on the carrier substrate 104 may be evenly spaced apart and mounted to the substrate 106 by a layer of adhesive 108 (e.g., as shown in FIG. 3). With reference to FIG. 10, showing a cross sectional view of the LED dies 102 with positive photoresist material 1002, the positive photoresist material 1002 is a light-sensitive material that is initially insoluble and becomes soluble when exposed to light. For example, after exposure to light, the positive photoresist material 1002 can be removed with a solvent, such as a photoresist developer. The positive photoresist material 1002 can be mixed with a solvent such that the material is viscous for placement (e.g., via spin coating), and then baked (e.g., soft baking) on the LED dies 102.

The positive photoresist material 1002 eventually forms an elayer 110 over the LED dies 102. In some embodiments, the positive photoresist material 1002 includes materials to increase adhesion to the pick-up surfaces 1304. For example, the positive photoresist material 1002 is mixed with a functional group material which is able to bind (e.g., covalently) to the non-conformable pick-up surface 1304. In some embodiments, the elastomeric material is cured in connection with baking the positive photoresist material 1002. In other embodiments, a separate curing process is used to cure the elastomeric material.

Figure 11:
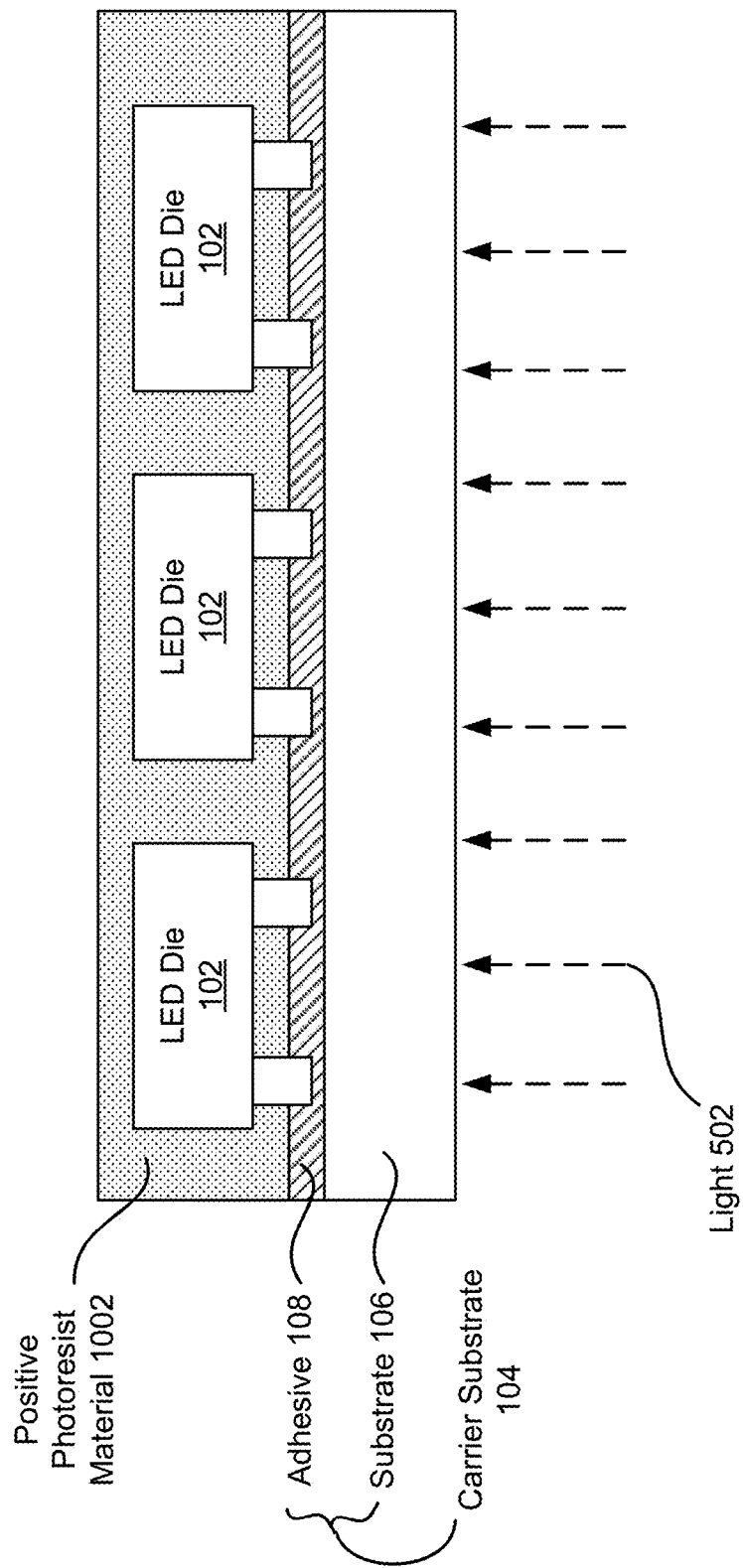
FIG. 11 is a cross sectional view of the LED dies with applied light, according to one embodiment.

After depositing the positive photoresist material 1002, light is applied 904 through the carrier substrate 104 towards the LED dies 102 and the positive photoresist material 1002. With reference to FIG. 11, showing a cross sectional view of the LED dies 102 with applied light 502, the carrier substrate 104 is, at least partially, transparent to the applied light 502. The transparent carrier substrate 104 allows the light 502 to shine on portions of the positive photoresist material 1002 that are not blocked by the LED dies 102. One advantage of method 900 is that a photomask and masking process is not required to selectively block light from reaching portions of the positive photoresist material 1002 over the LED dies 102. In some embodiments, the light 502 is collimated ultraviolet (UV) light, such that the carrier substrate 104 is transparent to the UV light 502, while the LED dies 102 absorb the UV light 502.

Figure 12:
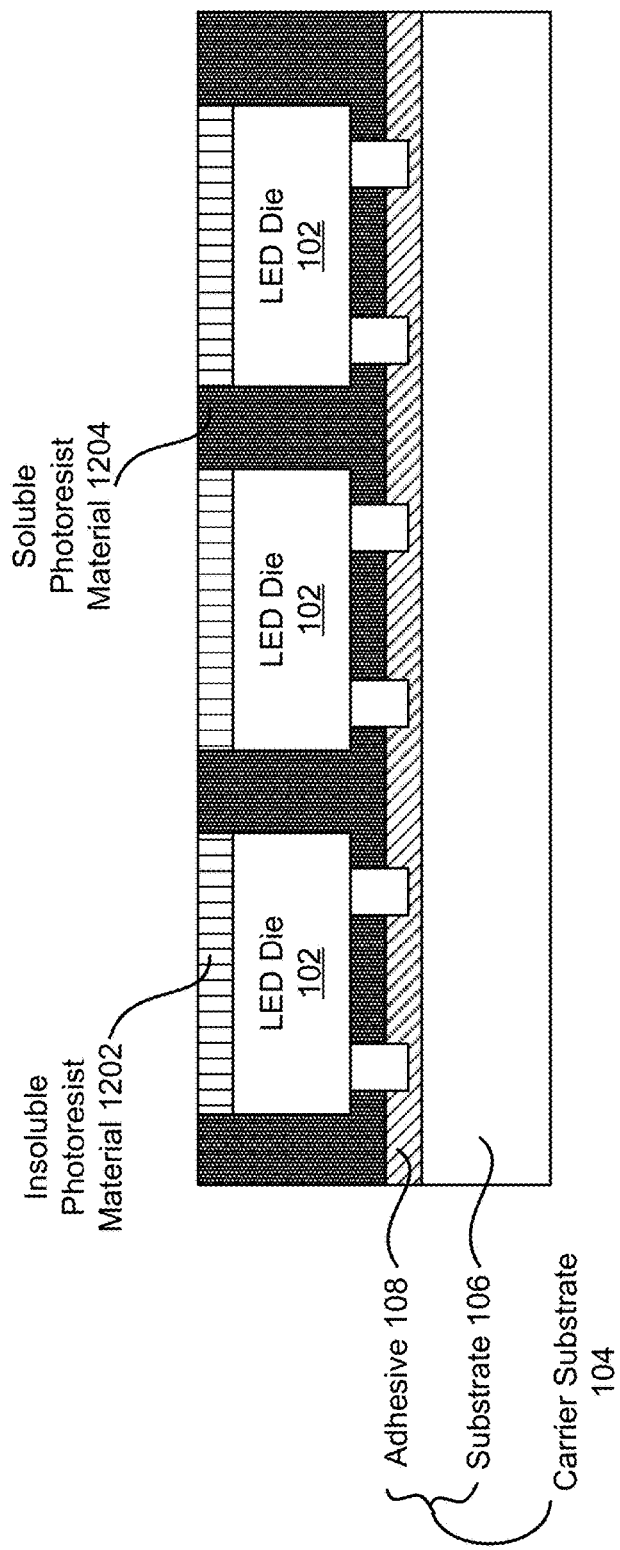
FIG. 12 is a cross sectional view of LED dies on the carrier substrate with portions of soluble photoresist material and other portions of insoluble photoresist material that forms elayers on the LED dies, according to one embodiment.

Portions of the light 502 incident on the LED dies 102 are absorbed 906 to retain insoluble first portions of the positive photoresist material 1002 on the LED dies 102. With reference to FIG. 12, showing a cross sectional view of the LED dies 102 including insoluble photoresist material 1202 and soluble photoresist material 1204, the light 502 is absorbed by the LED dies 102 so that the positive photoresist material 1002 on top of the LED dies 102 is not exposed to the applied light 502 and remains insoluble photoresist material 1202.

Second portions of the photoresist material between the LED dies 102 are exposed 908 to another portion of light 502 to render the second portions soluble. The light 502 renders the portions of the positive photoresist material 1002 soluble, forming the soluble photoresist material 1204 between the LED dies 102.

The second portions of the photoresist material (the soluble photoresist material 1204) are removed 910, to form an elayer 110 on each of the LED dies 102, from the first portions of the insoluble photoresist material 1202. The soluble photoresist material 1204 can be removed with a solvent. The solvent may be a photoresist developer that dissolves soluble photoresist material 1204, but is benign to insoluble photoresist material 1202. The remaining insoluble photoresist material 1202 forms the elayers 110 on the LED dies 102. The elayer 110 is conformable layer that allows each of the LED dies 102 to be attached to and picked up by a pick-up surface 1304 of a pick and place head (PPH) 1302. In some embodiments, the insoluble photoresist material 1202 is cured after removal of the soluble photoresist material 1204 to form the elayers 110.

Figure 13:
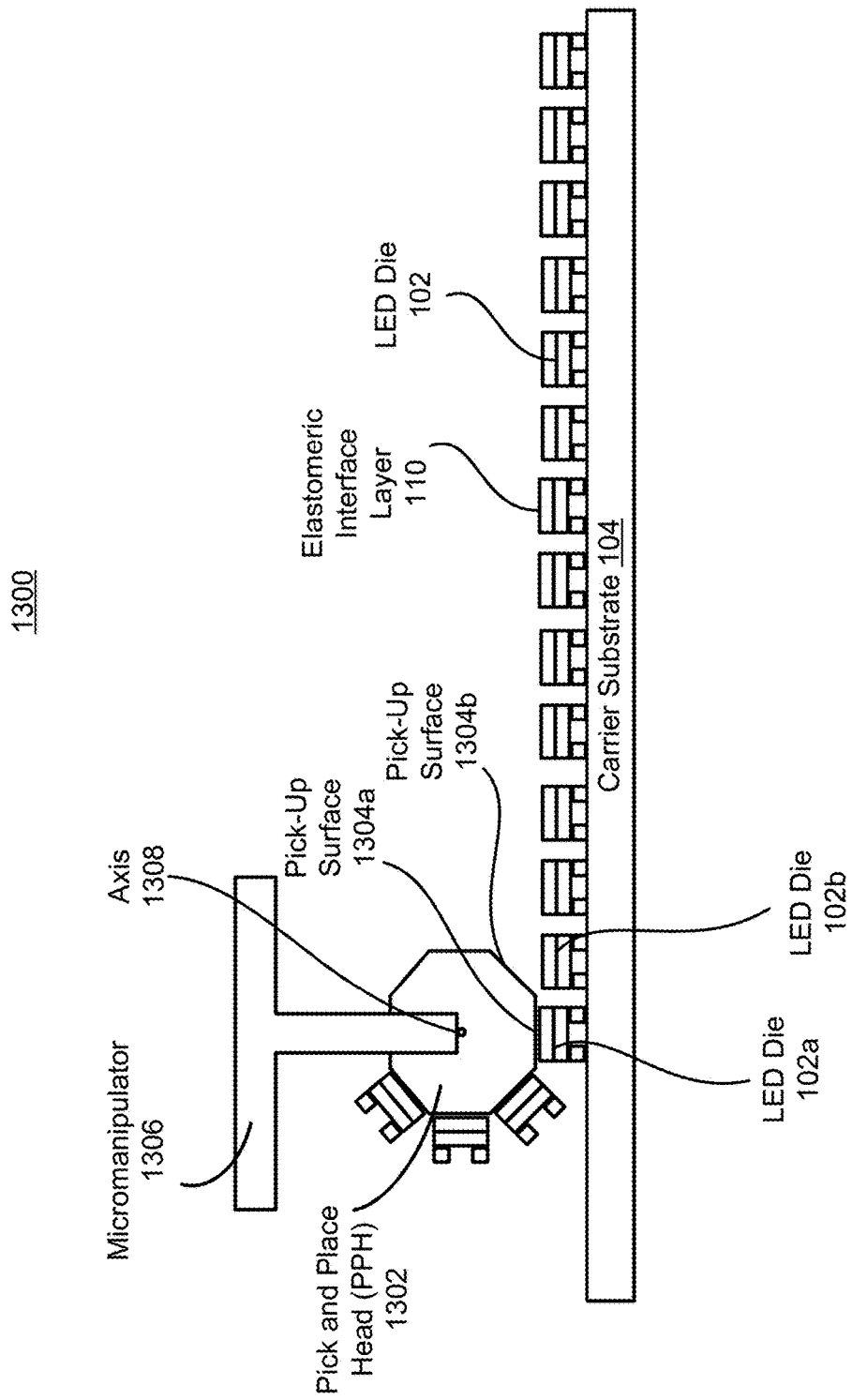
FIG. 13 is a display manufacturing system during pick up of LED dies from a carrier substrate, according to one embodiment.

FIG. 13 is a display manufacturing system 1300 during pick up of the LED dies 102 from a carrier substrate 104, according to one embodiment. The system 1300 includes a PPH 1302 for picking LED dies 102 from the carrier substrate 104. The system 1300 includes the LED dies 102, the carrier substrate 104, a micromanipulator 1306, a PPH 1302 defining an axis 1308, and pick-up surfaces 1304. The LED dies 102 are mounted to the carrier substrate 104. The micromanipulator 1306 moves the PPH 1302, such as with 6 degrees of freedom. The PPH 1302 includes pick-up surfaces 1304 that adheres with the elayers 110 of the LED dies 102 for pick and place operations.

The micromanipulator 1306 is connected to the PPH 1302 and controls movement of the PPH 1302. The micromanipulator 1306 aligns the PPH 1302 with the carrier substrate 104 to allow the PPH 1302 to pick up one or more LED dies 102. In some embodiments, the micromanipulator 1306 may be a multiple degree of freedom micromanipulator, such as a four degree of freedom micromanipulator configured to move the PPH 1302 up and down, left and right, forward and back, or rotate the PPH 1302 (e.g., along the rotational axis 1308). In some embodiments, the system 1300 includes multiple micromanipulators 1306 and/or PPHs 1302 to perform pick and place tasks in parallel to increase throughput of the system.

The PPH 1302 has a polygon shaped cross section. The edges of the polygon shape cross section define multiple pick-up surfaces 1304 of the PPH 1302. The elayer 110 of each LED dies 102 are configured to mount to the pick-up surfaces 1304 (e.g., due to adhesion forces) to facilitate transfer of the LED dies 102 from the carrier substrate 104 to a display substrate 1402. The PPH 1302 may be rotated along the rotational axis 1308 to pick up arrays of LED dies 102 at one or more pick-up surfaces 1304. Although the PPH 1302 has an octagonal cross section and eight pick-up surfaces 1304, a PPH 1302 may have different shaped cross sections (e.g., triangular, square, hexagon, etc.) and different numbers of pick-up surfaces in various embodiments.

Although the pick and place tool discussed herein is a PPH 1302, other types of pick-up heads using adhesive attachment with elayers 110 may be used.

The pick-up surfaces 1304 may be non-conformable pick-up heads that allow the LED dies 102 with elayers 110 to attach to the PPH 1302. For example, the pick-up surfaces 1304 may be glass or fused silica. The pick-up surfaces 1304 interface with the elayer 110 of the LED dies 102 using adhesion forces, such as Van der Waals. The adhesive 108 may be removed from the carrier substrate 104 before the pick-up surfaces 1304 attach to the elayer 110 of each LED die 102. Although the elayers 110 discussed herein are particularly adapted for non-conformable pick-up heads, in some embodiments, the pick-up surfaces 1304 are conformable, such as with an elastomeric coating.

Subsequent to the PPH 1302 picking up the one or more first LED dies 102a with the first pick-up surface 1304a, the PPH 1302 is rotated about axis 1308 to pick up one or more second LED dies 102b with a second pick-up surface 1304b of the PPH 1302. The second pick-up surface 1304b may be adjacent to the first pick-up surface 1304a, as shown in FIG. 13, or may be a non-adjacent pick-up surface 1304 to the first pick-up surface 1304a.

FIG. 14 is a cross sectional view of the display manufacturing system 1300 during LED die 102 placement on a display substrate 1402, according to one embodiment. The LED dies 102 attached to the PPH 1302 via the elayers 110 are placed on the display substrate 1402 of an electronic display.

After the PPH 1302 has been populated with LED dies 102, the PPH 1302 is moved away from the carrier substrate 104 and aligned with the display substrate 1402. For example, the PPH 1302 may be lifted away from the carrier substrate 104 by the micromanipulator 1306 for subsequent placement of the LED dies 102 on the display substrate 1402. The micromanipulator 1306 places the LED dies 102 on the display substrate 1402 by aligning the PPH 1302 with the display substrate 1402 and rolling the PPH 1302 across the display substrate 1402. The display substrate 1402 may be part of an electronic display with the LED dies 102 placed at sub-pixel locations to connect with the control circuits in the display substrate 1402 that drive the LED dies 102. For example, the display substrate 1402 may be a printed circuit board including gate lines and data lines for a control circuit at each sub-pixel that drive the LED dies 102 according to signals on the gate and data lines. After placement, the LED dies 102 may be bonded to the display substrate 1402, such as using thermocompression (TC) bonding.

Figure 15:
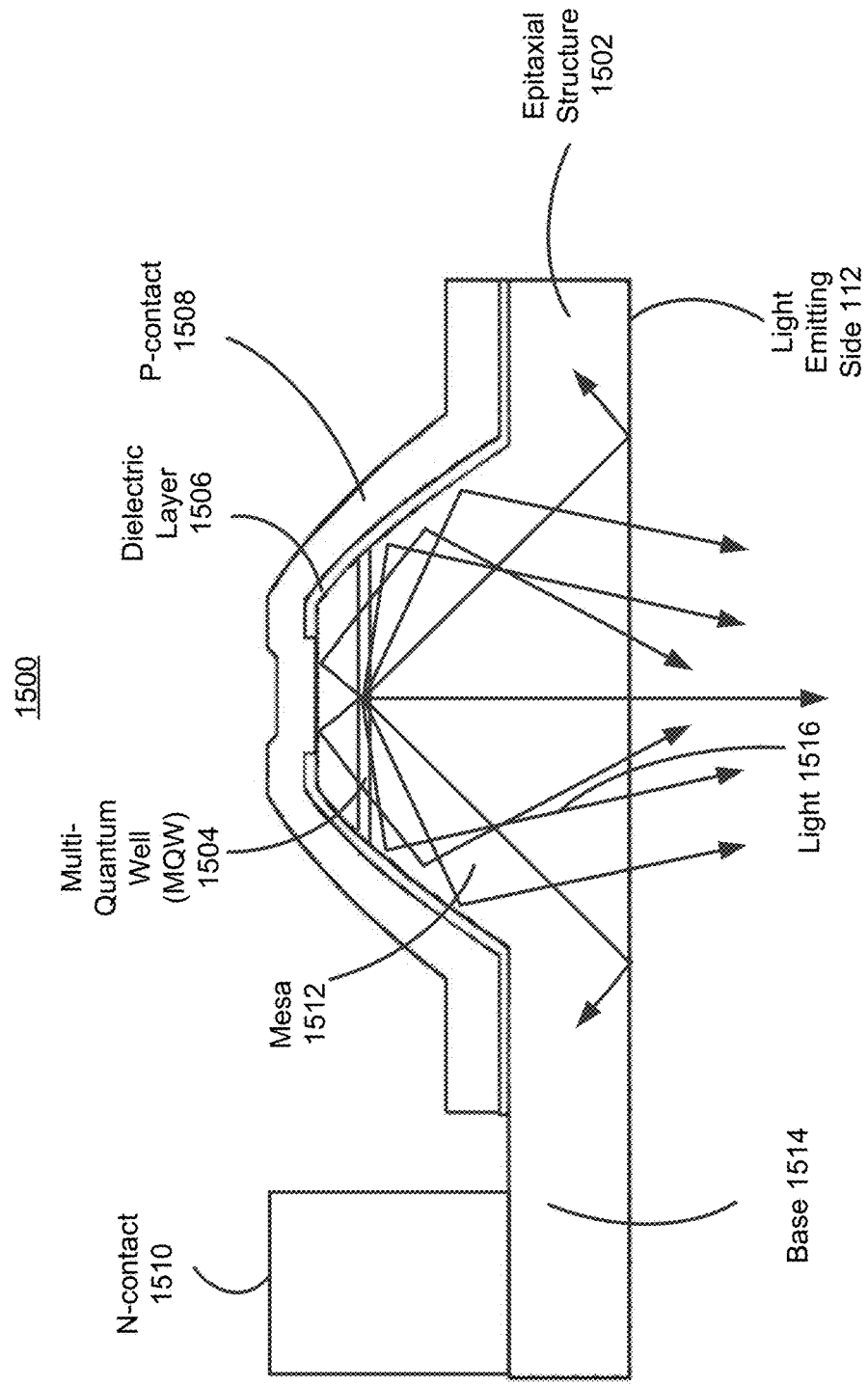
FIG. 15 is a schematic diagram of a cross section of a micro-LED, according to one embodiment.

FIG. 15 is a schematic diagram of a cross section of a mLED 1500, according to one embodiment. The mLED 1500 is an example of an LED die 102 having a light emitting side 112 on which the elayer 110 is formed to facilitate adhesive attachment with a pick-up head. The mLED 1500 may include, among other components, an epitaxial structure 1502 formed on a growth substrate (not shown). The epitaxial structure 1502 includes a multi-quantum well ("MQW") 1504. The mLED 1500 further includes a dielectric layer 1506 on the epitaxial structure 1502, a p-contact 1508 on the dielectric layer 1506, and an n-contact 1510 on the epitaxial structure 1502. The epitaxial structure 1502 is shaped, such as via an etch process, into a mesa 1512 and a base 1514 of the mesa 1512. The multi-quantum well 1504 defines an active light emitting area that is included in the structure of the mesa 1512. The mesa 1512 may include a truncated top defined on a side opposed to a light emitting side 112 of the mLED 1500.

If the semiconductor structure of the mLED 1500 is grown on a growth substrate, such as a non-transparent substrate, the growth substrate may be removed to reveal the light emitting side 112 as shown in FIG. 15. In another example, the growth substrate is not removed, such as when the growth substrate is transparent for the light emitted by the mLED 1500.

The mesa 1512 may include various shapes, such as a parabolic shape with a truncated top, to form a reflective enclosure for light 1516 generated within the mLED 1500. In other embodiments, the mesa 1512 may include a cylindrical shape with a truncated top, or a conic shape with a truncated top. The arrows show how the light 1516 emitted from the MQW 1504 is reflected off the p-contact 1508 and internal walls of the mesa 1512 toward the light emitting side 112 at an angle sufficient for the light to escape the mLED device 1500 (i.e., within a critical angle of total internal reflection). The p-contact 1508 and the n-contact 1510 connect the mLED 1500, such as to the display substrate including a control circuit for the mLED 1500. The n-contact 1510 is formed at the base 1514 on a side opposite the light emitting side 112.

The mLED 1500 may include an active light emitting area defined by the MQW 1504. The mLED 1500 directs the light 1516 from the MQW 1504 and increases the brightness level of the light output. In particular, the mesa 1512 and p-contact 1508 cause reflection of the light 1516 from the MWQ 1504 to form a collimated or quasi-collimated light beam emerging from the light emitting side 112.

The foregoing description of the embodiments has been presented for the purpose of illustration; it is not intended to be exhaustive or to limit the patent rights to the precise forms disclosed. For example, the deposited layer may be made of other materials, and the same method can be applied to micro-electric devices other than LEDs. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
   depositing a photoresist material on and between light emitting diode (LED) dies on a carrier substrate;
   applying light through the carrier substrate towards the LED dies and the deposited photoresist material, responsive to depositing the photoresist material;
   absorbing a portion of the light incident on the LED dies to retain soluble first portions of the photoresist material on the LED dies;
   exposing portions of photoresist material between the LED dies to another portion of the light to render second portions of the photoresist material between the LED insoluble;
   removing the first portions of photoresist material, responsive to applying the light;
   depositing an elastomeric material on each LED die and between the second portions of photoresist, responsive to removing the first portions; and
   removing the second portions of the photoresist material responsive to depositing the elastomeric material, the elastomeric material forming elastomeric interface layers on the LED dies.

2. The method of claim 1, further comprising:
   picking up at least a portion of the LED dies on the carrier substrate by attaching a non-conformable pick-up head to the elastomeric interface layers over the LED dies; and
   placing the at least a portion of the LED dies attached to the non-conformable pick-up head on a display substrate defining pixel control circuits of an electronic display.

3. The method of claim 1, further comprising:
   fabricating the LED dies on a native substrate;
   attaching a carrier film capable of expanding to a first side of the LED dies on the native substrate;
   detaching the native substrate from the LED dies;
   singulating the LED dies attached to the carrier film;
   separating the LED dies by expanding the carrier film to define the open regions between the LED dies;
   bringing the carrier substrate to a second side of the LED dies, the carrier substrate including a substrate layer and an adhesive layer, the LED dies being attached to the adhesive layer of the carrier substrate with the open regions being defined between the LED dies; and
   separating the carrier film from the first side of the LED dies to expose the first side of the LED dies to the depositing of the elastomeric material.

4. The method of claim 1, wherein the carrier substrate includes an adhesive layer and a glass substrate layer, the LED dies attached to the carrier substrate by the adhesive layer.

5. The method of claim 1, wherein:
   removing the first portions of photoresist material includes dissolving the first portions with a first solvent; and
   removing the second portions of the photoresist material responsive to depositing the elastomeric material includes dissolving the second portions of the photoresist material with a second solvent different from the first solvent.

6. The method of claim 5, wherein:
   the first solvent is benign to the insoluble second portions of the photoresist material; and
   the second solvent is benign to the elastomeric material forming the elastomeric interface layers on the LED dies.

7. The method of claim 1, wherein the LED dies are micro-LEDs and include Gallium nitride (GaN), gallium arsenide (GaAs), or gallium phosphide (GaP).

8. A method, comprising:
   depositing a photoresist material on and at side surfaces of a light emitting diode (LED) die on a carrier substrate;
   applying light through the carrier substrate towards the LED die and the deposited photoresist material, responsive to depositing the photoresist material;
   absorbing a portion of the light incident on the LED die to retain a soluble first portion of the photoresist material on the LED die;
   exposing portions of photoresist material at the side surfaces of the LED die to another portion of the light to render second portions of the photoresist material at the side surfaces of the LED insoluble;
   removing the first portion of photoresist material, responsive to applying the light;

depositing an elastomeric material on the LED die and between the second portions of photoresist, responsive to removing the first portion; and removing the second portions of the photoresist material responsive to depositing the elastomeric material, the elastomeric material forming elastomeric interface layer on the LED die.

9. The method of claim 8, wherein the LED dies absorbs Ultraviolet (UV) light incident on the LED dies through the carrier substrate.

10. The method of claim 8, further comprising:
picking up the LED die on the carrier substrate by attaching a non-conformable pick-up head to the elastomeric interface layer over the LED die; and
placing the LED die attached to the non-conformable pick-up head on a display substrate defining pixel control circuits of an electronic display.

11. The method of claim 8, wherein the carrier substrate includes an adhesive layer and a glass substrate layer, the LED die is attached to the carrier substrate by the adhesive layer.

12. The method of claim 8, wherein:
removing the first portion of photoresist material includes dissolving the first portion with a first solvent; and
removing the second portions of the photoresist material responsive to depositing the elastomeric material includes dissolving the second portions of the photoresist material with a second solvent different from the first solvent.

13. The method of claim 12, wherein:
the first solvent is benign to the insoluble second portions of the photoresist material; and
the second solvent is benign to the elastomeric material forming the elastomeric interface layer on the LED die.

14. The method of claim 8, wherein the LED die includes Gallium nitride (GaN), gallium arsenide (GaAs), or gallium phosphide (GaP).

15. The method of claim 8, wherein the LED die is a micro-LED or vertical-cavity surface-emitting laser (VCSEL).

16. The method of claim 8, wherein the LED die absorbs Ultraviolet (UV) light incident on the LED die through the carrier substrate.

17. An electronic display panel fabricated by a method, comprising:
depositing a photoresist material on and between light emitting diode (LED) dies on a carrier substrate;
applying light through the carrier substrate towards the LED dies and the deposited photoresist material, responsive to depositing the photoresist material;
absorbing a portion of the light incident on the LED dies to retain soluble first portions of the photoresist material on the LED dies;
exposing portions of photoresist material between the LED dies to another portion of the light to render second portions of the photoresist material between the LED insoluble;
removing the first portions of photoresist material, responsive to applying the light;
depositing an elastomeric material on each LED die and between the second portions of photoresist, responsive to removing the first portions;
removing the second portions of the photoresist material responsive to depositing the elastomeric material, the elastomeric material forming elastomeric interface layers on the LED dies
picking up at least a portion of the LED dies on the carrier substrate by attaching a non-conformable pick-up head to the elastomeric interface layers over the LED dies; and
placing the at least a portion of the LED dies attached to the non-conformable pick-up head on a display substrate defining pixel control circuits of an electronic display.

18. The electronic display panel of claim 17, wherein:
removing the first portions of photoresist material includes dissolving the first portions with a first solvent; and
removing the second portions of the photoresist material responsive to depositing the elastomeric material includes dissolving the second portions of the photoresist material with a second solvent different from the first solvent.

19. The electronic display panel of claim 18, wherein:
the first solvent is benign to the insoluble second portions of the photoresist material; and
the second solvent is benign to the elastomeric material forming the elastomeric interface layers on the LED dies.

20. The electronic display panel of claim 17, wherein the LED dies are micro-LEDs and include Gallium nitride (GaN), gallium arsenide (GaAs), or gallium phosphide (GaP).

* * * * *

UNITED STATES PATENT AND TRADEMARK OFFICE
CERTIFICATE OF CORRECTION

| | | |
|---|---|---|
| PATENT NO. | : 10,319,705 B2 | Page 1 of 1 |
| APPLICATION NO. | : 15/789275 | |
| DATED | : June 11, 2019 | |
| INVENTOR(S) | : Daniel Brodoceanu and Oscar Torrents Abad | |

It is certified that error appears in the above-identified patent and that said Letters Patent is hereby corrected as shown below:

In the Claims

Column 13, Line 6, Claim 8, delete "forming elastomeric interface" and insert -- forming an elastomeric interface --.

Column 14, Lines 18-19, Claim 17, delete "layers on the LED dies" and insert -- layers on the LED dies; --.

Signed and Sealed this
Third Day of December, 2019

Andrei Iancu
*Director of the United States Patent and Trademark Office*